United States Patent
Park et al.

(10) Patent No.: US 12,557,677 B2
(45) Date of Patent: Feb. 17, 2026

(54) BACKSIDE POWER DISTRIBUTION NETWORK SEMICONDUCTOR ARCHITECTURE USING DIRECT EPITAXIAL LAYER CONNECTION AND METHOD OF MANUFACTURING THE SAME

(71) Applicant: SAMSUNG ELECTRONICS CO., LTD., Suwon-si (KR)

(72) Inventors: Saehan Park, Clifton Park, NY (US); Seungyoung Lee, Clifton Park, NY (US)

(73) Assignee: SAMSUNG ELECTRONICS CO., LTD. (KR)

( * ) Notice: Subject to any disclaimer, the term of this patent is extended or adjusted under 35 U.S.C. 154(b) by 157 days.

(21) Appl. No.: 17/220,664

(22) Filed: Apr. 1, 2021

(65) Prior Publication Data

US 2022/0230947 A1 Jul. 21, 2022

Related U.S. Application Data

(60) Provisional application No. 63/138,597, filed on Jan. 18, 2021.

(51) Int. Cl.
*H01L 23/498* (2006.01)
*H01L 21/48* (2006.01)
*H01L 23/528* (2006.01)

(52) U.S. Cl.
CPC ...... *H01L 23/49822* (2013.01); *H01L 21/486* (2013.01); *H01L 23/49838* (2013.01); *H01L 23/5286* (2013.01)

(58) Field of Classification Search
CPC ............ H01L 23/49822; H01L 21/486; H01L 23/49838; H01L 23/5286
See application file for complete search history.

(56) References Cited

U.S. PATENT DOCUMENTS

| | | | |
|---|---|---|---|
| 6,495,454 B2 | 12/2002 | Livengood et al. | |
| 8,809,188 B2 * | 8/2014 | Tezcan | H01L 23/481 438/667 |
| 9,087,885 B2 | 7/2015 | Ji et al. | |
| 9,136,302 B2 * | 9/2015 | Wang | H10F 39/809 |
| 9,870,980 B2 | 1/2018 | Yang et al. | |

(Continued)

FOREIGN PATENT DOCUMENTS

KR  10-2015-0025582 A  3/2015

OTHER PUBLICATIONS

Communication issued on May 19, 2025 from the Korean Intellectual Property Office for Korean Patent Application No. 10-2021-0071220.

*Primary Examiner* — Benjamin Tzu-Hung Liu
(74) *Attorney, Agent, or Firm* — Myers Bigel, P.A.

(57) ABSTRACT

Provided is a backside power distribution network (BSPDN) semiconductor architecture including a wafer, a first semiconductor device provided on a first surface of the wafer, the first semiconductor device including an active device that includes an epitaxial layer, a second semiconductor device provided on a second surface of the wafer opposite to the first surface, the second semiconductor device including a power rail configured to supply power, and a through-silicon via (TSV) protruding from the power rail and extending to a level of the epitaxial layer of the active device.

10 Claims, 20 Drawing Sheets

(56) References Cited

U.S. PATENT DOCUMENTS

| | | | |
|---|---|---|---|
| 10,566,288 B2 | 2/2020 | Kao et al. | |
| 2008/0001179 A1 | 1/2008 | Roy | |
| 2013/0140681 A1* | 6/2013 | Kelly | H01L 21/2885 |
| | | | 257/621 |
| 2014/0008757 A1 | 1/2014 | Ramachandran et al. | |
| 2015/0187642 A1* | 7/2015 | Batra | H01L 21/76898 |
| | | | 257/774 |
| 2016/0071900 A1 | 3/2016 | Hynecek et al. | |
| 2020/0194567 A1* | 6/2020 | Hiblot | H01L 27/0886 |
| 2021/0376093 A1* | 12/2021 | Chu | H10D 62/121 |
| 2021/0391318 A1* | 12/2021 | Peng | H01L 23/5286 |
| 2022/0139903 A1* | 5/2022 | Hung | H10D 84/0193 |
| | | | 257/355 |

* cited by examiner

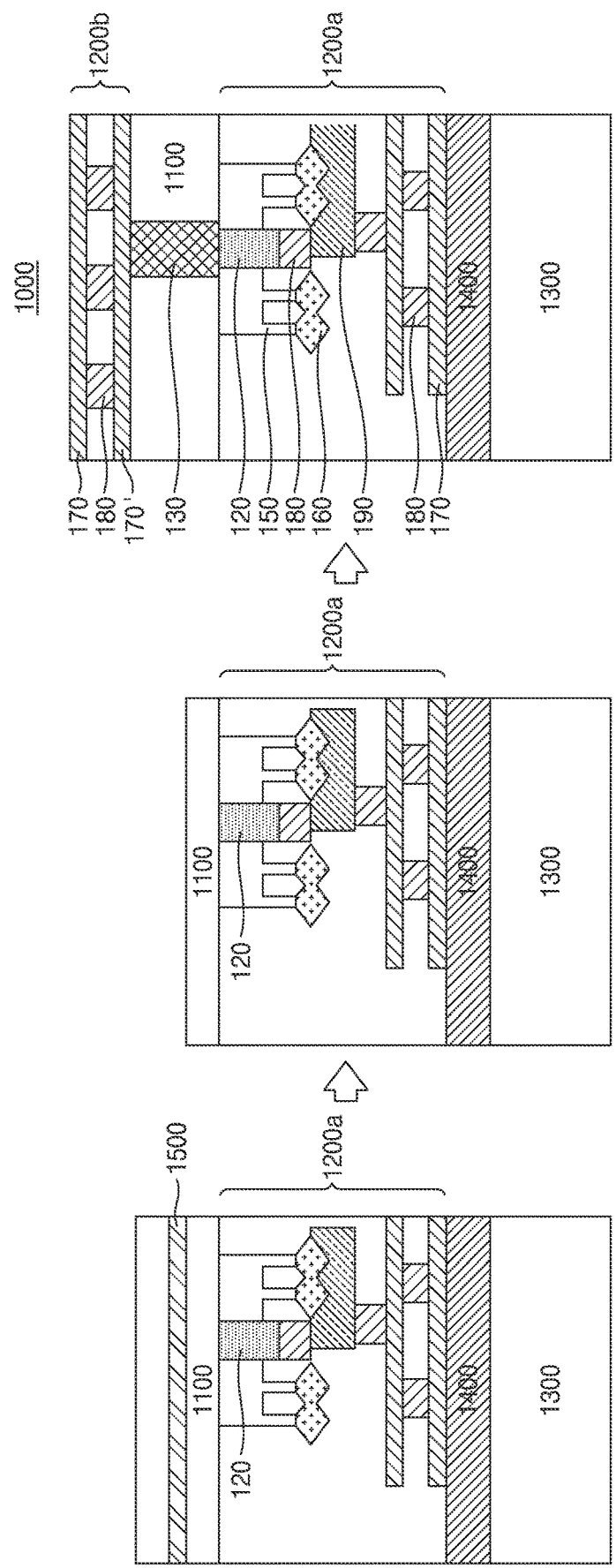

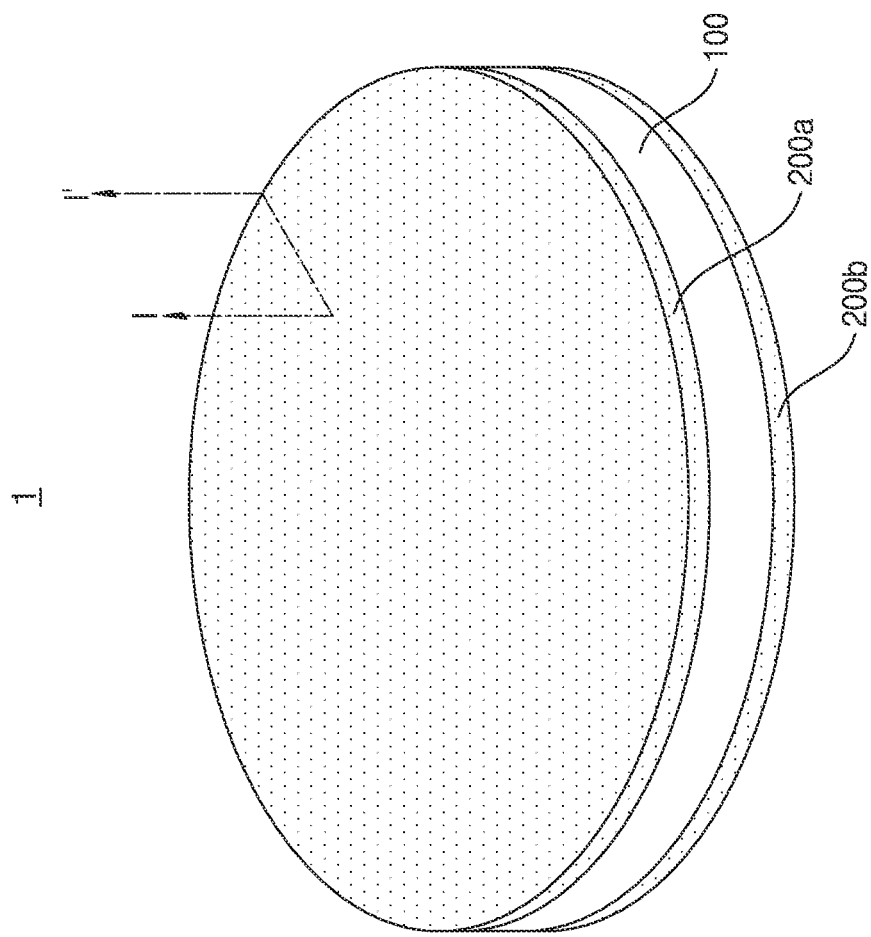

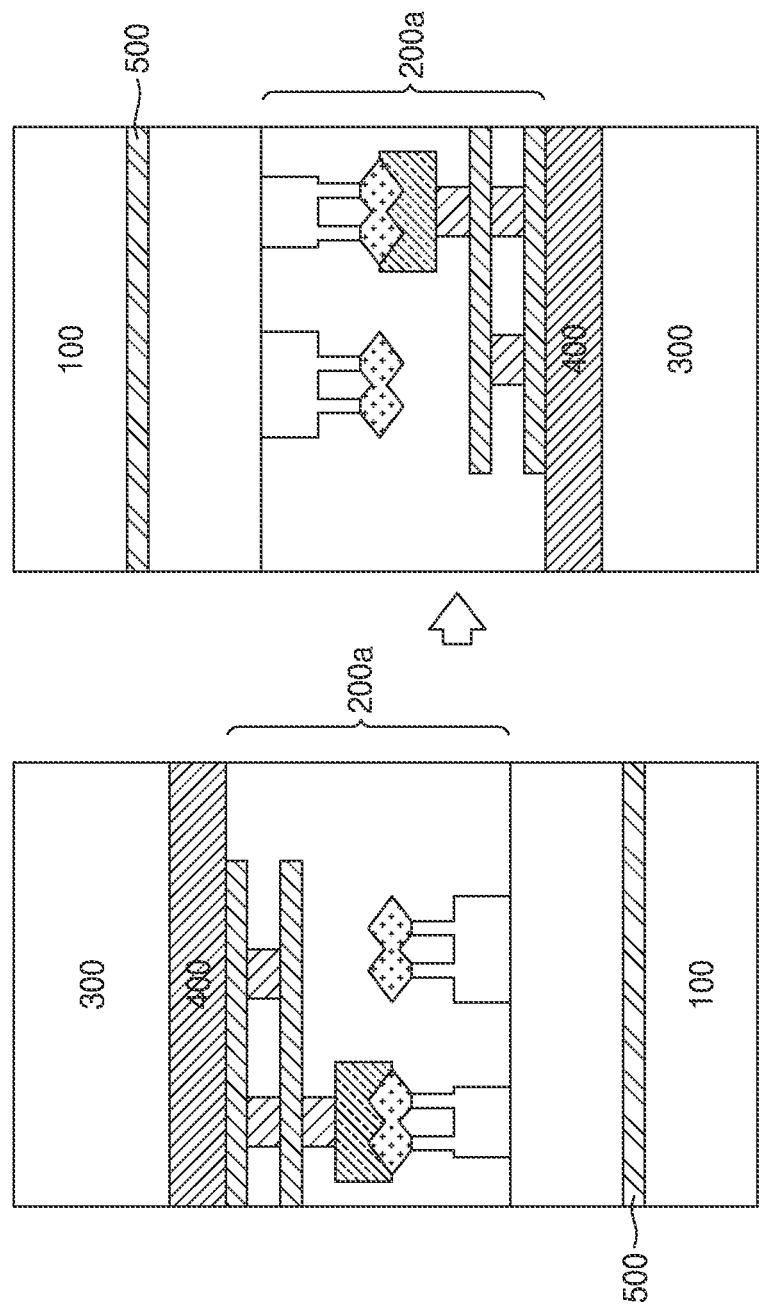

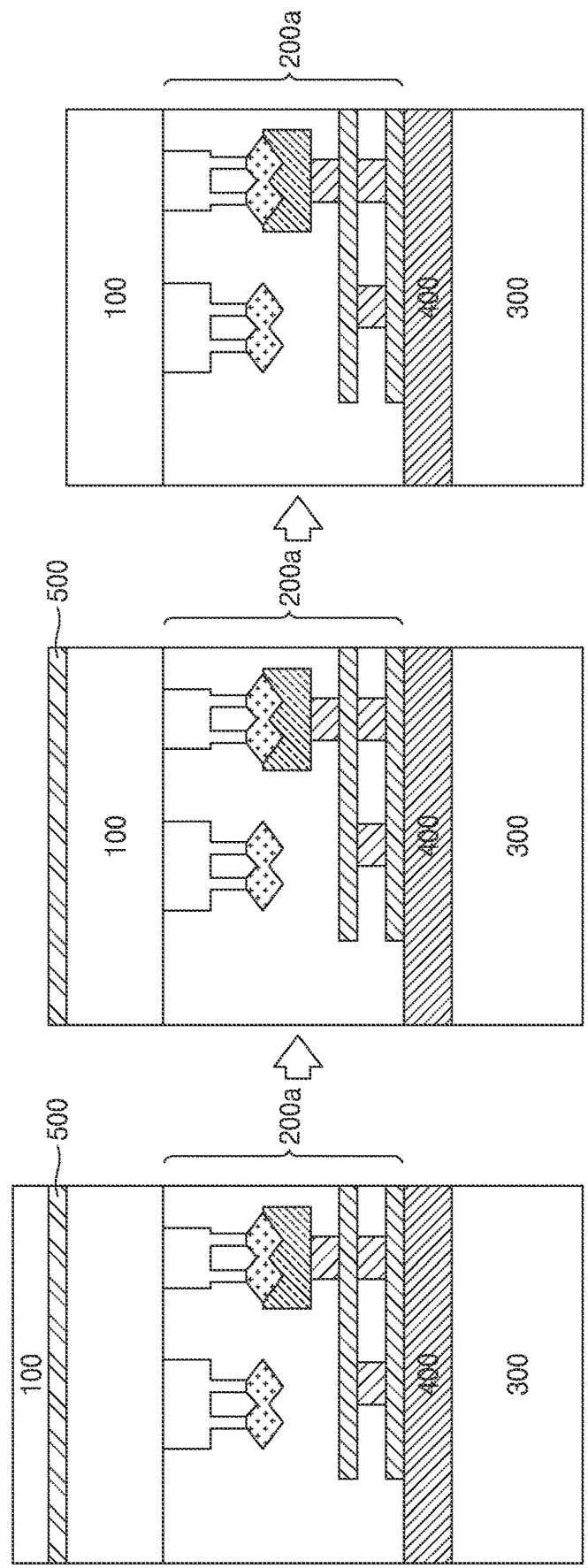

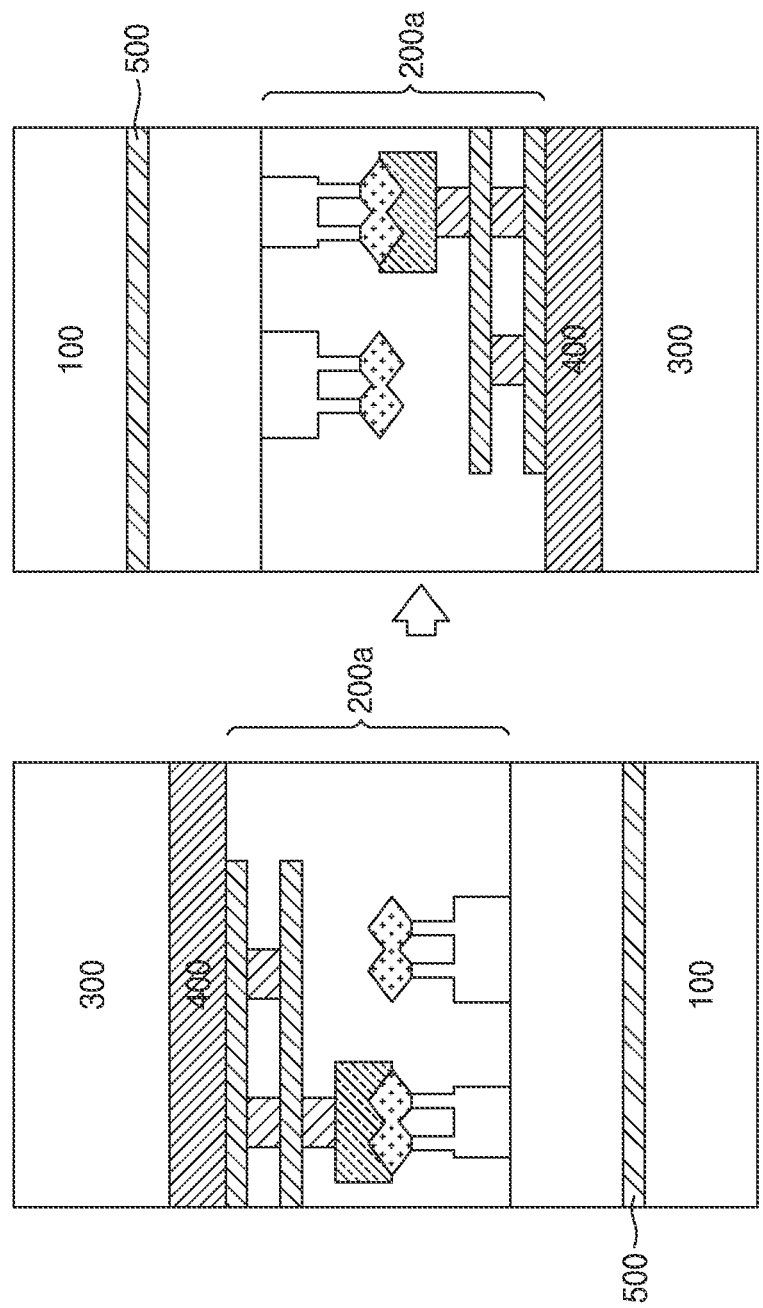

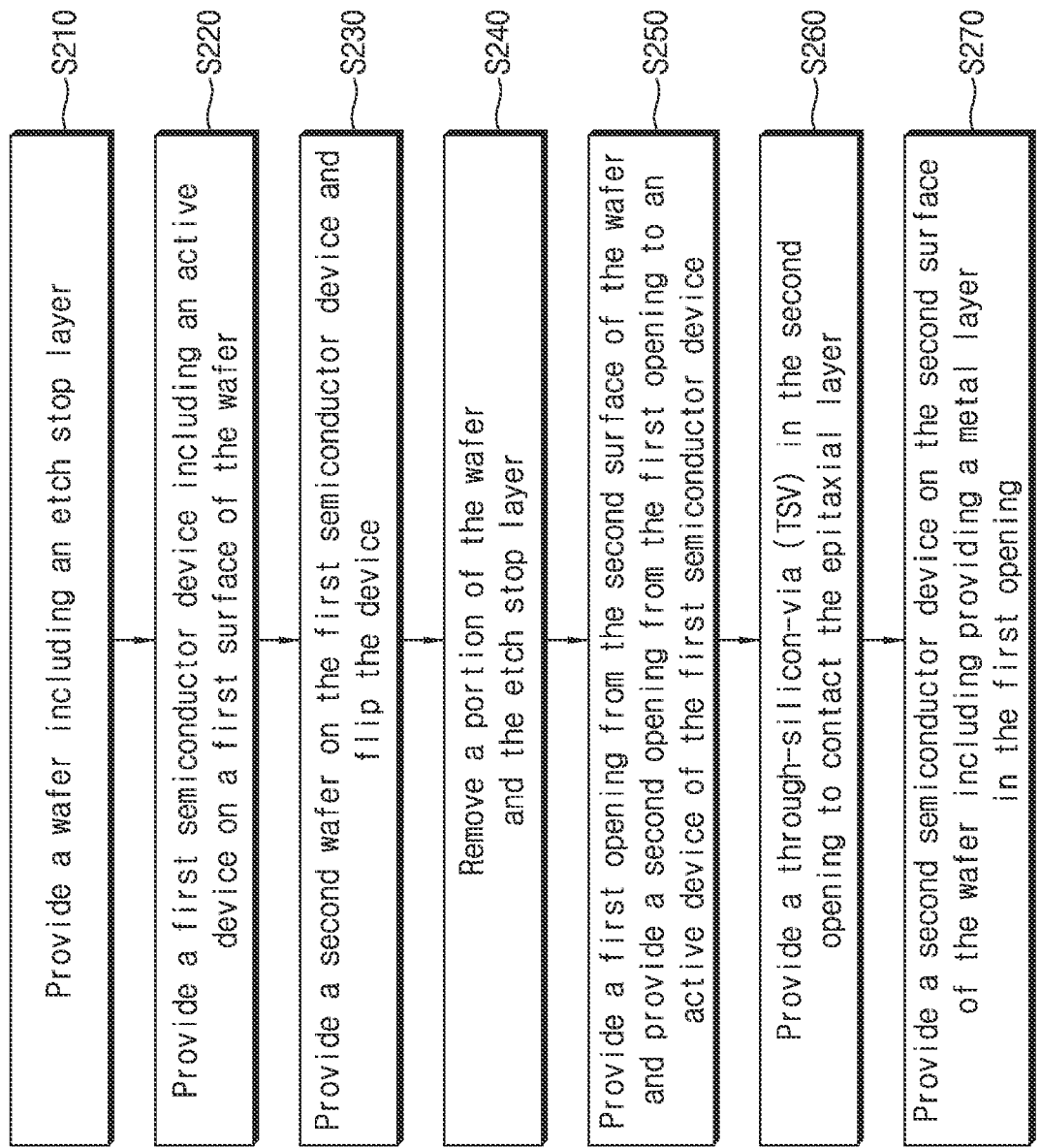

BACKSIDE POWER DISTRIBUTION NETWORK SEMICONDUCTOR ARCHITECTURE USING DIRECT EPITAXIAL LAYER CONNECTION AND METHOD OF MANUFACTURING THE SAME

CROSS-REFERENCE TO THE RELATED APPLICATION

This application is based on and claims benefit to U.S. Provisional Application No. 63/138,597 filed on Jan. 18, 2021 in the U.S. Patent and Trademark Office, the disclosure of which is incorporated herein in its entirety by reference.

BACKGROUND

1. Field

Example embodiments of the present disclosure relate to a backside power distribution network (BSPDN) semiconductor architecture and a method of manufacturing the same, and more particularly to a BSPDN semiconductor architecture including a back side through-silicon via (TSV) contacting an epitaxial layer of an active device of a front side semiconductor device and a method of manufacturing the same.

2. Description of Related Art

The BSPDN semiconductor architecture separates the signal wiring from the power distribution network (PDN) provided on a wafer by providing a semiconductor device such as an integrated circuit including active devices and signal wires for routing signals on a front side of the wafer and providing a PDN for supplying power on a back side of the wafer. The BSPDN semiconductor architecture may minimize the routing congestion and allow for down scaling of an area of the semiconductor architecture. A BSPDN semiconductor architecture may result in a ~30% reduction and an improved current-resistance (IR) drop as compared to a PDN semiconductor architecture.

However, there may be difficulties in manufacturing a BSPDN semiconductor architecture which requires multi-layers of elements to connect the PDN on a back side of the wafer with an active device included in the integrated circuit provided on a front side of the wafer. The multilayer elements and multiple interfaces provided between the multilayer elements may increase connection resistance of the BSPDN semiconductor architecture. In addition, inclusion of the multilayer elements may result in complex manufacturing process and increase in manufacturing cost.

Information disclosed in this Background section has already been known to the inventors before achieving the embodiments of the present application or is technical information acquired in the process of achieving the embodiments. Therefore, it may contain information that does not form the prior art that is already known to the public.

SUMMARY

One or more example embodiments provide a backside power distribution network (BSPDN) semiconductor architecture and a method of manufacturing the same.

One or more example embodiments also provide to a BSPDN semiconductor architecture including a back side TSV contacting an active device of a front side semiconductor device and a method of manufacturing the same.

According to an aspect of an example embodiment, there is provided a semiconductor architecture including a wafer, a first semiconductor device configured to route signals that is provided on a first surface of the wafer, the first semiconductor device including an active device that includes an epitaxial layer, a second semiconductor device configured to supply powers that is provided on a second surface of the wafer opposite to the first surface, and a through-silicon via (TSV) protruding from the second semiconductor device and connected to the epitaxial layer of the active device.

According to another aspect of an example embodiment, there is provided a method of manufacturing a semiconductor architecture, the method including providing a wafer, providing a first semiconductor device on a first surface of the wafer, the first semiconductor device including an active device that includes an epitaxial layer, providing a trench from a second surface of the wafer opposite to the first surface to a level of the epitaxial layer of the active device, providing a through-silicon via (TSV) in the trench such that the TSV is connected to the epitaxial layer of the active device, and providing a second semiconductor device on the second surface of the wafer.

According to another aspect of an example embodiment, there is provided a semiconductor architecture including a wafer, a first semiconductor device provided on a first surface of the wafer, the first semiconductor device including an active device that includes an epitaxial layer, a second semiconductor device provided on a second surface of the wafer opposite to the first surface, the second semiconductor device including a power rail configured to supply power, and a through-silicon via (TSV) protruding from the power rail and extending to a level of the epitaxial layer of the active device.

BRIEF DESCRIPTION OF THE DRAWINGS

The above and/or other aspects, features, and advantages of example embodiments of the disclosure will be more apparent from the following description taken in conjunction with the accompanying drawings, in which:

FIGS. 3A, 3B, and 3C illustrate a method of manufacturing a BSPDN semiconductor architecture according to a related embodiment;

FIG. 4 illustrates a perspective view of a BSPDN semiconductor architecture according to an example embodiment;

FIGS. 7A, 7B, 7C, and 7D illustrate a method of manufacturing a BSPDN semiconductor architecture illustrated in FIG. 5 according to an example embodiment;

FIGS. 8A, 8B, 8C, 8D, and 8E illustrate a method of manufacturing a BSPDN semiconductor architecture illustrated in FIG. 6 according to an example embodiment;

FIG. 10 illustrates a flowchart of a method of manufacturing a BSPDN semiconductor architecture according to another example embodiment;

DETAILED DESCRIPTION

Figure 1:
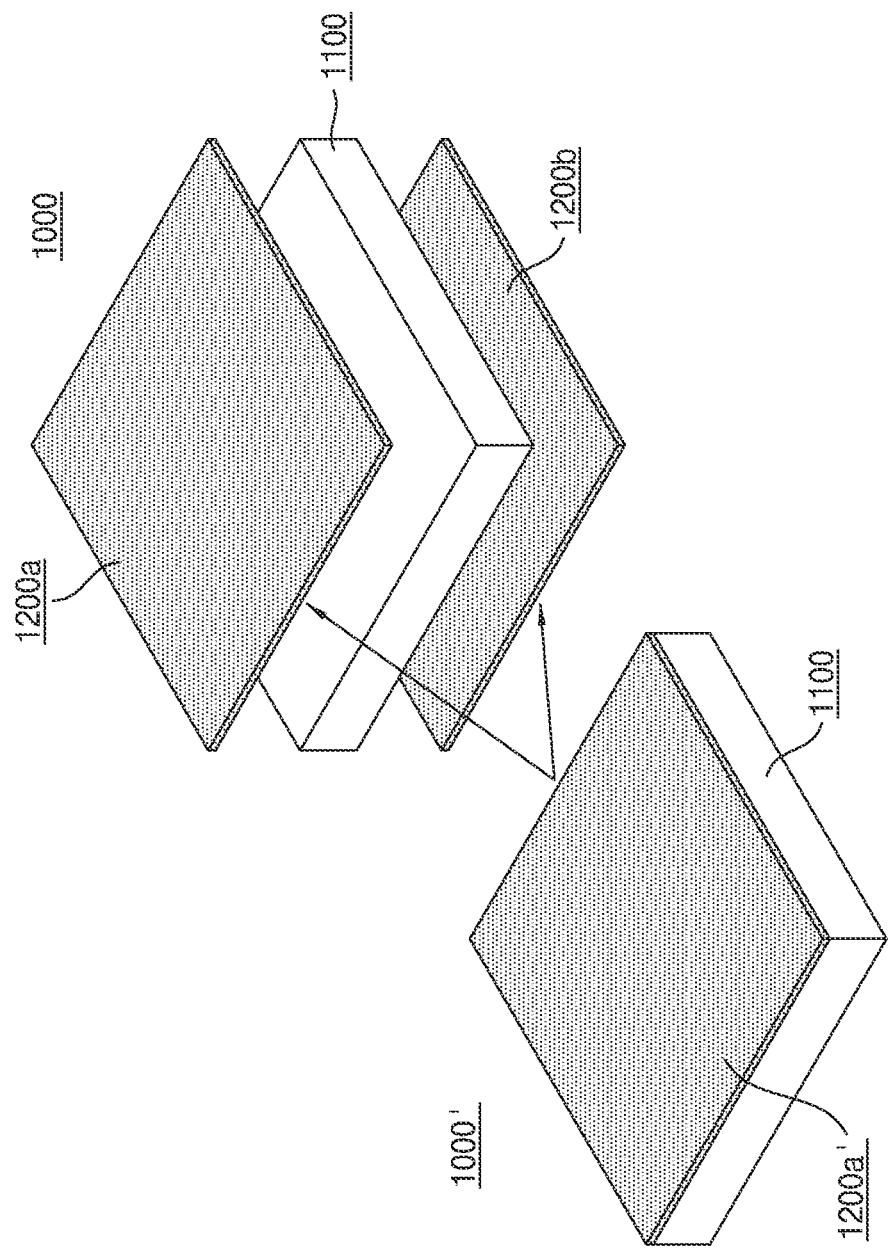
FIG. 1 illustrates a perspective view of a general PDN semiconductor architecture and a BSPDN semiconductor architecture according to an example embodiment.

The example embodiments described herein are examples, and thus, the present disclosure is not limited thereto, and may be realized in various other forms. Each of the example embodiments provided in the following description is not excluded from being associated with one or more features of another example or another example embodiment also provided herein or not provided herein but consistent with the present disclosure. For example, even if matters described in a specific example or example embodiment are not described in a different example or example embodiment thereto, the matters may be understood as being related to or combined with the different example or embodiment, unless otherwise mentioned in descriptions thereof.

In addition, it should be understood that all descriptions of principles, aspects, examples, and example embodiments are intended to encompass structural and functional equivalents thereof. In addition, these equivalents should be understood as including not only currently well-known equivalents but also equivalents to be developed in the future, that is, all devices invented to perform the same functions regardless of the structures thereof.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "top," and "bottom," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms "first," "second," "third," "fourth," etc. may be used herein to describe various elements, these elements should not be limited by these terms. These terms are only used to distinguish one element from another element. Thus, a first element discussed below could be termed a second element without departing from the teachings of the present disclosure.

It will be also understood that, even if a certain step or operation of manufacturing an apparatus or structure is described later than another step or operation, the step or operation may be performed later than the other step or operation unless the other step or operation is described as being performed after the step or operation.

Example embodiments are described herein with reference to cross-sectional illustrations that are schematic illustrations of the example embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure. Further, in the drawings, the sizes and relative sizes of layers and regions may be exaggerated for clarity.

For the sake of brevity, general elements to semiconductor devices may or may not be described in detail herein.

FIG. 1 illustrates a perspective view of a general PDN semiconductor architecture and a BSPDN semiconductor architecture according to an example embodiment.

Referring to FIG. 1, a general PDN semiconductor architecture 1000' includes a PDN/signal wiring device 1200a' on a front side of the wafer 1100. However, such configuration of the general PDN semiconductor architecture 1000' causes routing congestion in the PDN/signal wiring device 1200a' and increases a total area of the semiconductor architecture. In addition, a resistance of the general PDN semiconductor architecture 1000' may be relatively high.

As illustrated in FIG. 1, according to an example embodiment, a BSPDN semiconductor architecture 1000 is configured to separate a first semiconductor device 1200a for signal wiring, to be provided a front side of the wafer 1100, from a second semiconductor device 1200b for power distribution to be provided on a back side of the wafer 1100 opposite to the first semiconductor device 1200a. The BSPDN semiconductor architecture 1000 according to an example embodiment may reduce the routing congestion and the area of the semiconductor architecture by removing the PDN from the front side of the wafer, and hence may also improve an IR drop. For example, a total area of the semiconductor architecture may be reduced by 30% compared to the general PDN semiconductor architecture 1000'. However, embodiments are not limited thereto.

Figure 2:
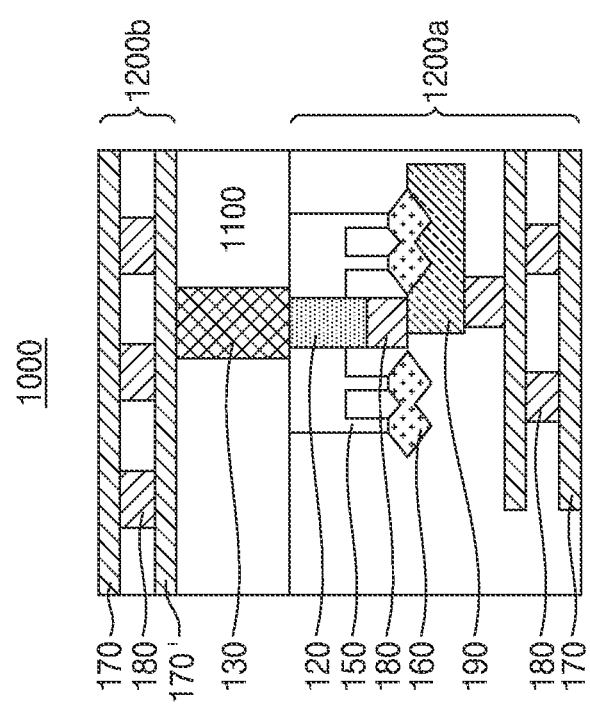
FIG. 2 illustrates a BSPDN semiconductor architecture according to a related embodiment.

FIG. 2 illustrates a BSPDN semiconductor architecture according to a related embodiment.

Referring the FIG. 2, the semiconductor architecture 1000 may include a wafer 1100, a first semiconductor device 1200a provided on a first surface of the wafer 1100, and a second semiconductor device 1200b provided on a second surface of the wafer 1100. The first semiconductor device 1200a may be an integrated circuit configured to route signals, and may include components such as, for example, active devices (for example, transistors), signal wires, and BPRs 120, etc. For example, the active devices may include fins 150 and epitaxial layers 160 provided on the fins 150. The epitaxial layers 160 and fins 150 may include silicon (Si). The active devices may also include epitaxial layers provided on nanosheets, nanowires, etc. The active devices may be provided in a front-end-of-line (FEOL) layer on the first surface of the wafer 1100. In the middle-of-the-line (MOL) layer of the first semiconductor device 1200a, an epitaxial contact 190 may be provided to contact the epitaxial layer 160 and extend in a horizontal direction parallel to the first surface of the wafer 1100. A via 180 may be provided on a surface of the epitaxial contact 190 facing the wafer 1100, and a BPR 120 may be provided on the via 180 contacting the epitaxial contact 190, and protrude toward the wafer 1100. In the back-end-of-line (BEOL) layer of the first semiconductor device 1200a, metal layers 170 configured route signals may be provided. Vias 180 may be provided between the metal layers 170 to connect the metal layers 170, and vias 180 may be provided between the epitaxial contact 190 and a metal layer 170 to connect the signal wiring layer to the active device.

The active devices may include a power tapping epitaxial layer and a non-power tapping epitaxial layer. The metal layers 170 are connected to the non-power tapping epitaxial layer of the active device for signal routing between the active devices. The BPR 120 is connected to the power tapping epitaxial layer of the active devices and are not connected to the metal layers 170. The BPR 120 is configured to deliver power to the active devices.

The second semiconductor device 1200b may be an integrated circuit including a PDN. The back-end-of-line (BEOL) layer of the second semiconductor device 1200b may include a power rail metal layer 170' configured to operate as VDD/VSS power rail that is provided on a second surface of the wafer 1100. The BEOL layer may also include a metal layer 170 and vias 180 provided between the power rail metal layer 170' and the metal layer 170. In addition, a TSV 130 configured to operate as a power connecting structure may protrude from the power rail metal layer 170' and penetrate the wafer 1100 to contact the BPR 120.

As illustrated in FIG. 2, multiple layers are provided between the power rail metal layer 170' included in the second semiconductor device 1200b and an epitaxial layer 160 of the active device included in the first semiconductor device 1200a. For example, a TSV 130, a BPR 120, a via 180, and an epitaxial contact 190 may be provided between the power rail metal layer 170' and the epitaxial layer 160.

According to the BSPDN semiconductor architecture 1000 of a related embodiment, the multiple layers provided between the power rail metal layer 170' and the epitaxial layer 160 may increase connection resistance. In addition, the manufacturing process of the BSPDN semiconductor architecture 1000 may become more complex and the manufacturing cost may increase. Further, a misalignment between the TSV 130 and the BPR 120 may occur which may increase the resistance of the BSPDN semiconductor architecture 1000 and lead to a device failure of the BSPDN semiconductor architecture 1000.

Figure 3A:
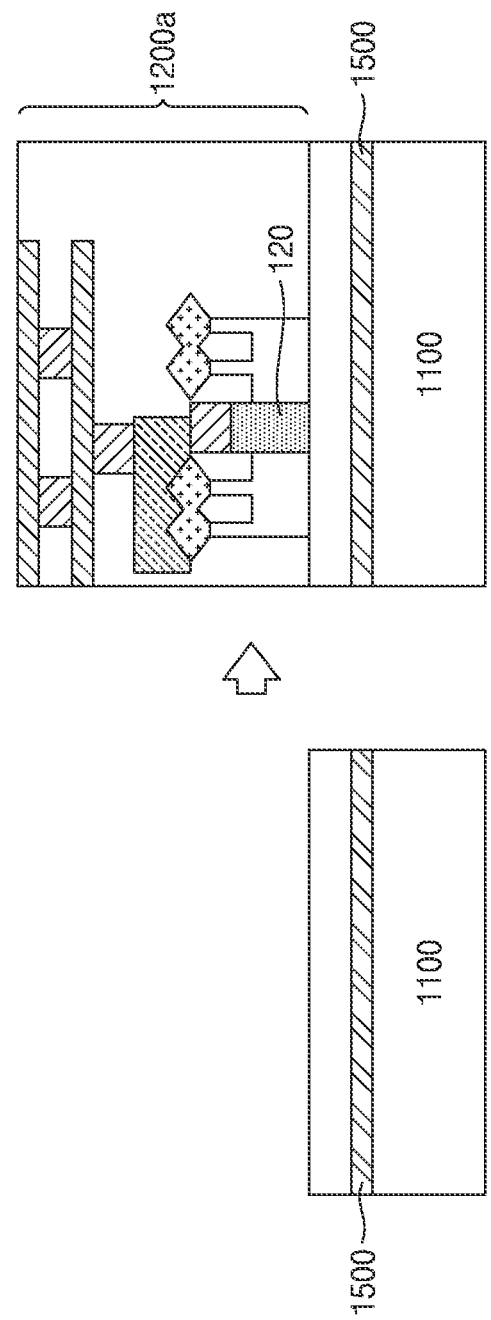
Figure 3B:
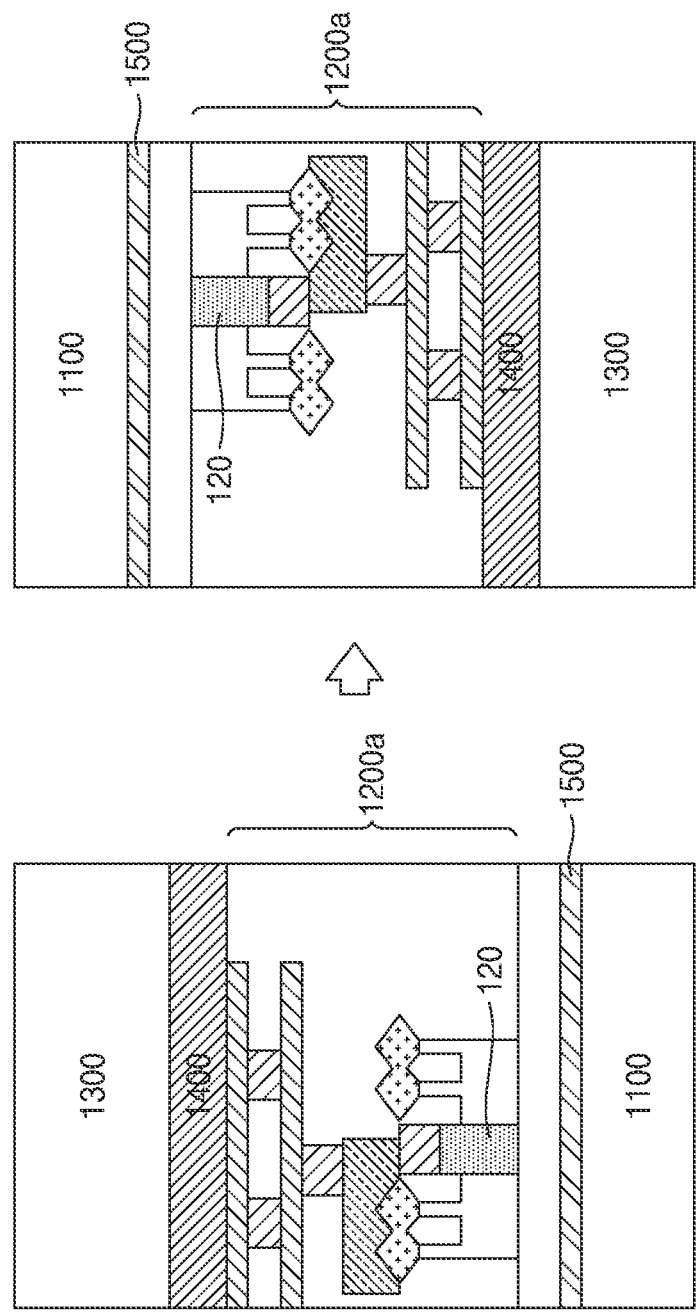

FIGS. 3A through 3C illustrate a method of manufacturing a BSPDN semiconductor architecture according to a related embodiment.

As illustrated in FIG. 3A, the method may include providing a wafer 1100 including an etch stop layer 1500. The etch stop layer 1500 may be included in the wafer 1100.

A first semiconductor device 1200a may be provided on a first surface of the wafer 1100. The first semiconductor device 1200a may be an integrated circuit including components such as, for example, active devices, signal wires, and BPRs 120. The BPR 120 may be provided on a first surface of the wafer 1100.

Referring to FIG. 3B, a wafer-to-wafer bonding process may be carried out. For example, a second wafer 1300 may be provided on a first surface of the first semiconductor device 1200a. The second wafer 1300 may be bonded by an adhesive layer 1400 provided between the first semiconductor device 1200a and the second wafer 1300. After the wafer-to-wafer bonding, the semiconductor architecture is flipped.

Referring to FIG. 3C, a portion of the wafer 1100 opposite to the first surface may be removed to a level of the etch stop layer 1500. The etch stop layer 1500 may be removed to expose a second surface of the wafer 1100.

A second semiconductor device 1200b may be provided on the second surface of the wafer 1100. The second semiconductor device 1200b may be an integrated circuit including PDN for power distribution. The BEOL layer of the second semiconductor device 1200b may include a power rail metal layer 170' and a metal layer 170. Vias 180 may be provided between the power rail metal layer 170' and the metal layer 170. In addition, a TSV 130 may protrude from the second semiconductor device 1200b. The TSV 130 be in contact with the power rail metal layer 170' and penetrate the wafer 1100 to contact the BPR 120 included in the first semiconductor device 1200a.

As illustrated in FIG. 3C, multiple layers including a TSV 130, BPR 120, via 180, epitaxial contact 190 are provided between the power rail metal layer 170' protruding from the second semiconductor device 1200b provided on the second surface of the wafer 1100 and an epitaxial layer 160 of the active device included in the first semiconductor device 1200a provided on the first surface of the wafer 1100.

The multiple layers provided between the power rail metal layer 170' and the epitaxial layer 160 may increase connection resistance of the BSPDN semiconductor architecture 1000 according to the related embodiment. The manufacturing process of the BSPDN semiconductor architecture 1000 may become more complex and the manufacturing cost may increase. In addition, a misalignment between the TSV 130 and the BPR 120 may occur which may increase the resistance of the BSPDN semiconductor architecture and may lead to a device failure of the BSPDN semiconductor architecture 1000.

FIG. 4 illustrates a perspective view of a BSPDN semiconductor architecture according to an example embodiment.

As illustrated in FIG. 4, the BSPDN semiconductor architecture 1 may include a wafer 100, a first semiconductor device 200a provided on a first surface of the wafer 100, and a second semiconductor device 200b provided on a second surface of the wafer 100 opposite to the first semiconductor device 200a. The first semiconductor device 200a and the second semiconductor device 200b may be integrated to each other and may form a BSPDN semiconductor architecture 1 according to an example embodiment.

The wafer 100 may include, for example, a Si substrate, a glass substrate, a sapphire substrate, etc. However, embodiments are not limited thereto. As illustrated in FIG. 4, the wafer 100 may be a circular panel, but the shape of the wafer 100 is not limited thereto. For example, the wafer 100 may be a tetragonal panel. The wafer 100 may include a single layer or multiple layers.

Figure 5:
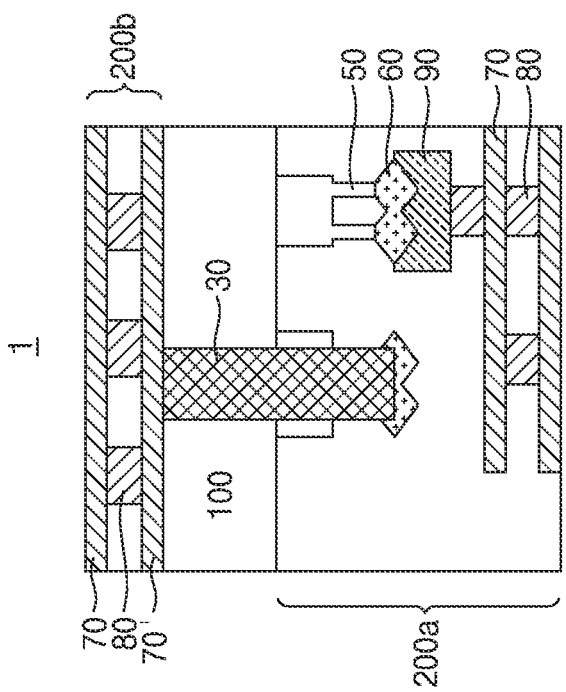
FIG. 5 illustrates a cross-sectional view taken along line I-I' of FIG. 4 according to an example embodiment.

FIG. 5 illustrates a cross-sectional view taken along line I-I' of FIG. 4 according to an example embodiment.

According to the example embodiment, the BSPDN semiconductor architecture 1 includes a first semiconductor device 200a provided on a first surface of the wafer 100 and a second semiconductor device 200b provided on a second surface of the wafer 100.

The first semiconductor device 200a may be an integrated circuit including an active device (for example, transistor) and signal wires. For example, the FEOL layer of the first semiconductor device 200a may include an active device including fins 50 and epitaxial layers 60 provided on the fins 50. The epitaxial layers 60 and the fins 50 may include Si. However, embodiments are not limited thereto. For example, the active device may include epitaxial layers 60 provided on nanosheets, nanowires, etc. The active device may be provided on the first surface of the wafer 100. The MOL layer of the first semiconductor device 200a may include an epitaxial contact 90 provided on the epitaxial layer 60 and extending in a horizontal direction parallel to the first surface of the wafer 100. The BEOL layer of the first semiconductor device 200a may include metal layers 70 configured to route signals. The metal layers 70 may include a metal material with low resistance such as, for example, copper (Cu). However, embodiments are not limited thereto. Vias 80 may be provided between the metal layers 70 to connect the metal layers 70, and vias 80 may be provided between the epitaxial contact 90 and a metal layer 70 to connect the signal wiring layer to the active device.

In comparison to the first semiconductor device 200a included in a BSPDN semiconductor architecture 1000 as illustrated in FIG. 2, the first semiconductor device 200a included in a BSPDN semiconductor architecture 1 according to an example embodiment does not include a BPR.

The second semiconductor device 200b may be an integrated circuit including PDN configured to distribute power. The BEOL layer of the second semiconductor device 200b may include a power rail metal layer 70' configured to operate as VDD/VSS power rail that is provided on a second surface of the wafer 100. The BEOL layer may also include a metal layer 70 and vias 80 provided between the power rail metal layer 70' and the metal layer 70. In addition, a TSV 30 configured to operate as a power connecting structure may protrude from the power rail metal layer 70' and penetrate the wafer 100. The TSV 30 may be provided to directly contact the epitaxial layer 60 included in an active device of the first semiconductor device 200a and the power rail metal layer 70' of the second semiconductor device 200b.

For example, as illustrated in FIG. 5, the TSV 30 extends vertically from a surface of the second semiconductor device 200b to the level of the epitaxial layer 60 of the first semiconductor device 200a. The height of the TSV 30 may vary depending on the thickness of the wafer 100, and may range from around 200 nm to 500 nm. However, embodiments are not limited thereto.

According to the example embodiment as illustrated in FIG. 5, the TSV 30 is directly connected to the epitaxial layer 60, and there are no additional elements provided between the TSV 30 and the epitaxial layer 60. Accordingly, the connection resistance of the BSPDN semiconductor architecture 1 may be lowered. The manufacturing process of the BSPDN semiconductor architecture 1 may be simplified and the manufacturing cost may be reduced. In addition, there is no concern for a misalignment between the TSV 30 and a BPR which may lead to misalignment between the first semiconductor device 200a and the second semiconductor device 200b. Thus, the performance of the BSPDN semiconductor architecture 1 may be improved.

Figure 6:
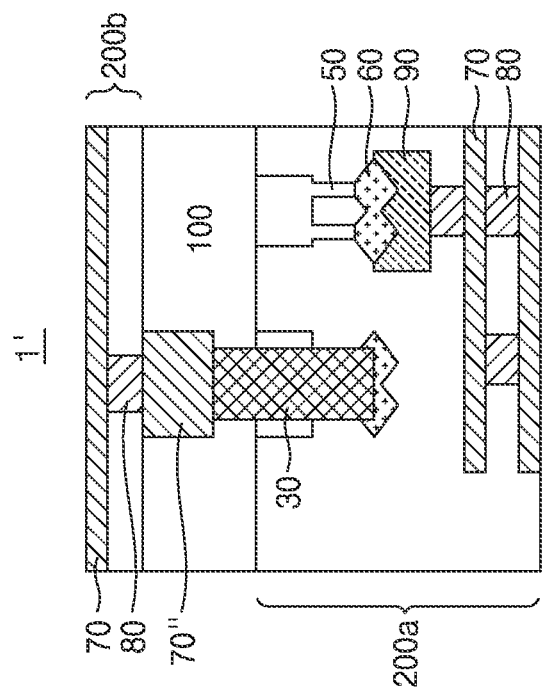
FIG. 6 illustrates a cross-sectional view taken along line I-I' of FIG. 4 according to another example embodiment

FIG. 6 illustrates a cross-sectional view taken along line I-I' of FIG. 4 according to another example embodiment.

According to the example embodiment, the BSPDN semiconductor architecture 1' includes a first semiconductor device 200a provided on a first surface of the wafer 100 and a second semiconductor device 200b provided on a second surface of the wafer 100.

The first semiconductor device 200a may be an integrated circuit including an active device (for example, transistor) and signal wires. For example, the FEOL layer of the first semiconductor device 200a may include an active device including fins 50 and epitaxial layers 60 provided on the fins 50. However, embodiments are not limited thereto. For example, the active device may include epitaxial layers 60 provided on nanosheets, nanowires, etc. The active device may be provided on the first surface of the wafer 100. The MOL layer of the first semiconductor device 200a may include an epitaxial contact 90 provided on the epitaxial layer 60 and extend in a horizontal direction parallel to the first surface of the wafer 100. The BEOL layer of the first semiconductor device 200a may include metal layers 70 configured to route signals. The metal layers 70 may include a metal material with low resistance such as, for example, Cu. However, embodiments are not limited thereto. Vias 80 may be provided between the metal layers 70 to connect the metal layers 70, and vias 80 may be provided between the epitaxial contact 90 and a metal layer 70 to connect the signal wiring layer to the active device.

In comparison to the first semiconductor device 200a included in a BSPDN semiconductor architecture 1000 as illustrated in FIG. 2, the first semiconductor device 200a included in a BSPDN semiconductor architecture 1' according to an example embodiment does not include a BPR.

The second semiconductor device 200b may be an integrated circuit including PDN configured to distribute power. The BEOL layer of the second semiconductor device 200b may include an embedded power rail metal layer 70" configured to operate as VDD/VSS power rail that is at least partially embedded in a second surface of the wafer 100. For example, the embedded power rail metal layer 70" may be provided to at least partially penetrate the second surface of the wafer 100. The BEOL layer of the second semiconductor device 200b also includes a via 80 that is provided on the embedded power rail metal layer 70" and a metal layer 70 provided on the via 80. A TSV 30 protrudes from a surface of the embedded power rail metal layer 70" and penetrates the wafer 100 to be connected the epitaxial layer 60 of the active device included in the first semiconductor device 200a. The TSV 30 may be provided to directly contact the epitaxial layer 60 included in an active device of the first semiconductor device 200a and the embedded power rail metal layer 70" of the second semiconductor device 200b.

As illustrated in FIG. 6, the TSV 30 extends from a first surface of the embedded power rail metal layer 70" to a level of the epitaxial layer 60 of the first semiconductor device 200a. The height of the TSV 30 may vary depending on the thickness of the wafer 100 and may range from around 200 nm to 500 nm. However, embodiments are not limited thereto.

Similar to the example embodiment as illustrated in FIG. 5, according to the example embodiment as illustrated in FIG. 6, as the TSV 30 is directly connected to the epitaxial layer 60, and there are no additional elements provided between the TSV 30 and the epitaxial layer 60, the connection resistance of the BSPDN semiconductor architecture 1' may be lowered. The manufacturing process of the BSPDN semiconductor architecture 1' may be simplified and the manufacturing cost may be reduced. In addition, there is no concern for a misalignment between the TSV 30 and a BPR which may lead to misalignment between the first semiconductor device 200a and the second semiconductor device 200b. Thus, the performance of the BSPDN semiconductor architecture 1' may be improved.

In addition, according to the example embodiment as illustrated in FIG. 6, a height of the TSV 30 may be reduced compared to a height of the TSV 30 according to the example embodiment in FIG. 5. Accordingly, the aspect ratio of the TSV 30 may be reduced which may further lower resistance and facilitate the manufacturing process of the TSV 30.

A width of the TSV 30 may depend on the width of the embedded power rail metal layer 70" and may be less than a width of the embedded power rail metal layer 70". However, embodiments are not limited thereto.

FIGS. 7A through 7D illustrate a method of manufacturing a BSPDN semiconductor architecture illustrated in FIG. 5 according to an example embodiment.

Figure 7A:
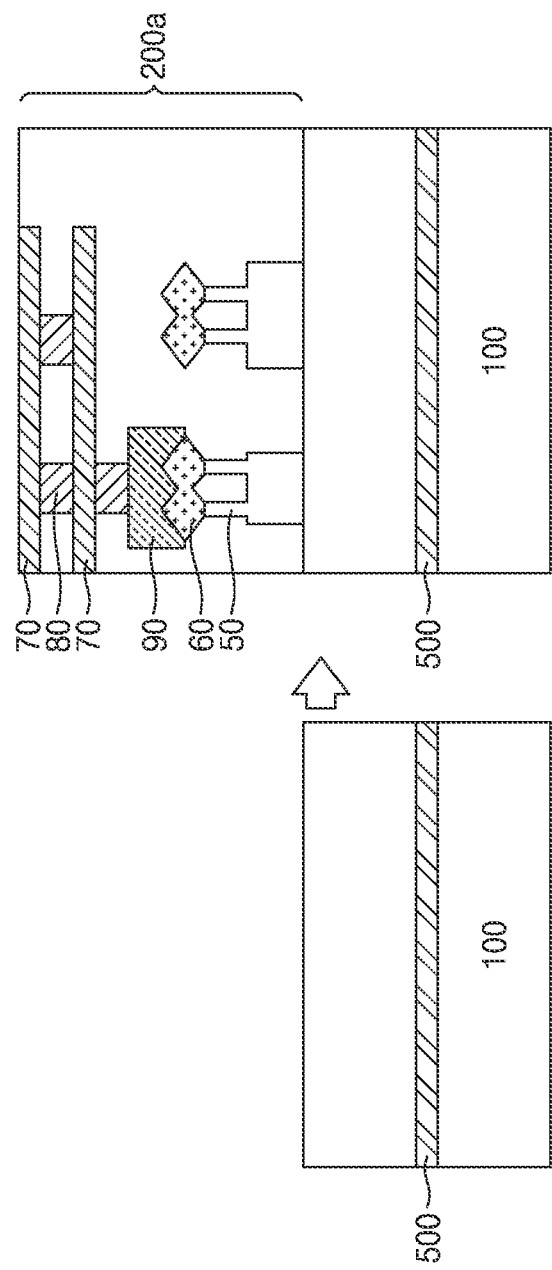

Referring to FIG. 7A, a wafer 100 including an etch stop layer 500 is provided. The wafer 100 may be a Si layer, and the etch stop layer may be a silicon germanium (SiGe) layer, but embodiments are not limited thereto. For example, the etch stop layer may be an oxide layer in a silicon-on-insulator (SOI) wafer.

A first semiconductor device 200a is provided on the first surface of the wafer 100. Providing the first semiconductor device 200a includes by providing an active device including fins 50 and epitaxial layers 60 on the first surface of the wafer. However, embodiments are not limited thereto. For example, providing the active device may include providing epitaxial layers 60 on nanosheets, nanowires, etc. An epitaxial contact 90 may be provided on the epitaxial layer 60 that extends in a horizontal direction parallel to the first surface of the wafer 100. A via 80 may be provided on the epitaxial contact 90. Metal layers 70 configured to route signals may be provided on the via 80, connected to the epitaxial contact 90, to be connected to the active device. Vias 80 may be provided between the metal layers 70 to connect the metal layers 70.

Referring to FIG. 7B, a wafer-to-wafer bonding process may be carried out. For example, a second wafer 300 may be provided on a first surface of the first semiconductor device 200a. The second wafer 300 may be bonded to the first semiconductor device 200a by providing an adhesive layer 400 between the first semiconductor device 200a and the second wafer 300. However, embodiments are not limited thereto. According to another example embodiment, the second wafer 300 may be directly provided on the first semiconductor device 200a. For example, the second wafer 300 may be directly bonded to the first semiconductor device 200a by a Si direct bonding without using an adhesive layer. After the wafer-to-wafer bonding, the semiconductor architecture may be flipped.

Referring to FIG. 7C, a portion of a back side the wafer 100 from the second surface may be removed to a level of the etch stop layer 500. The etch stop layer 500 may be removed to expose a second surface of the wafer 100. A portion of the wafer 100 and the etch stop layer 500 may be removed by a grinding process including, for example, chemical-mechanical polishing (CMP) or dry etching. However, embodiments are not limited thereto.

Figure 7D:
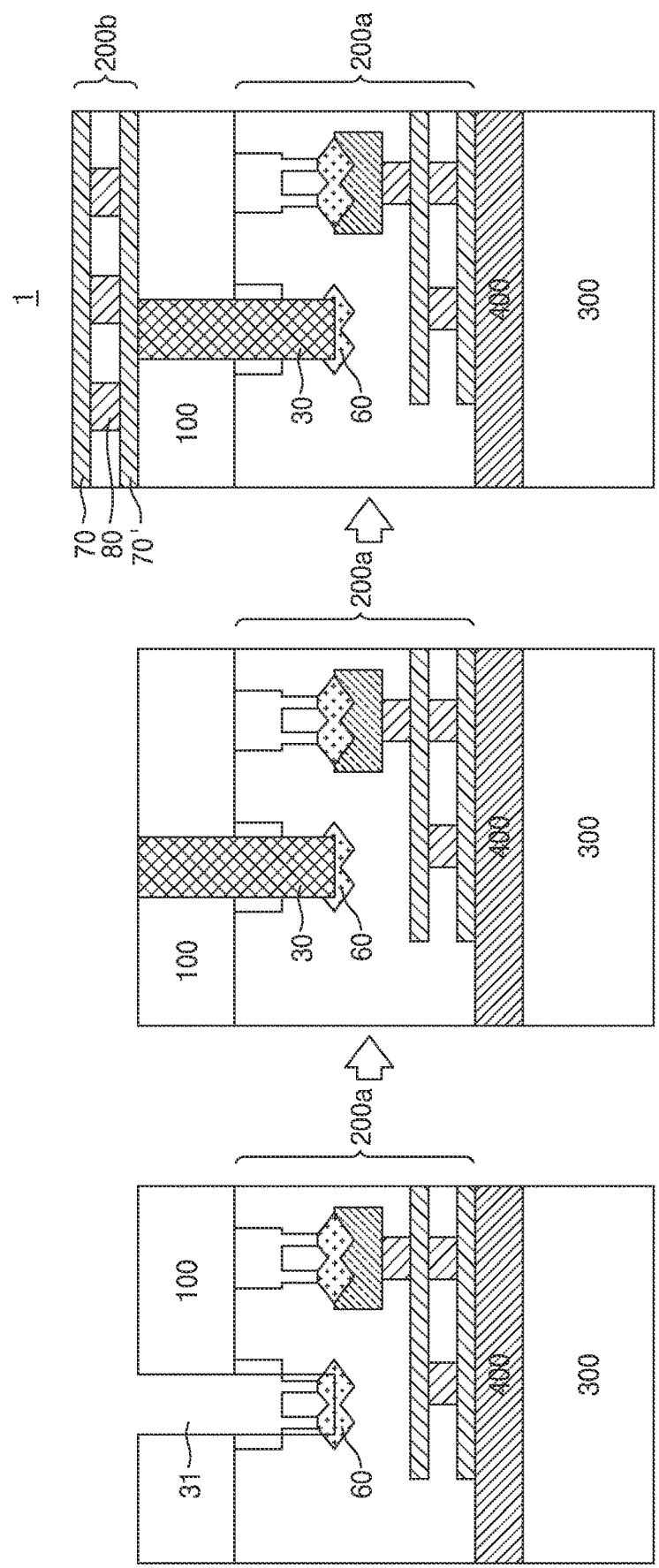

Referring to FIG. 7D, a TSV opening 31 may be formed on the exposed second surface of the wafer 100 to a level of the epitaxial layer 60 such that the TSV opening 31 exposes the epitaxial layer 60. The TSV opening 31 may be a trench formed by, for example, dry etching or wet etching. However, embodiments are not limited thereto. The TSV opening 31 is filled with a conductive material with a relatively low resistance such as, for example, Cu to form a TSV 30. However, the conductive material is not limited thereto. The TSV 30 is formed to be in direct contact with the epitaxial layer 60. An upper surface of the TSV 30 may be coplanar with the exposed surface of the wafer 100.

Referring to FIG. 7D, a second semiconductor device 200b is provided on the exposed second surface of the wafer 100 and an exposed surface of the TSV 30. Providing the second semiconductor device 200b includes providing a power rail metal layer 70' configured to operate as a VDD/VSS power rail to supply power on the exposed surface of the wafer 100 and the TSV 30. Vias 80 are provided on the power rail metal layer 70' and a metal layer 70 may be provided on the vias 80.

FIGS. 8A through 8E illustrate a method of manufacturing a BSPDN semiconductor architecture illustrated in FIG. 6 according to an example embodiment.

Figure 8A:
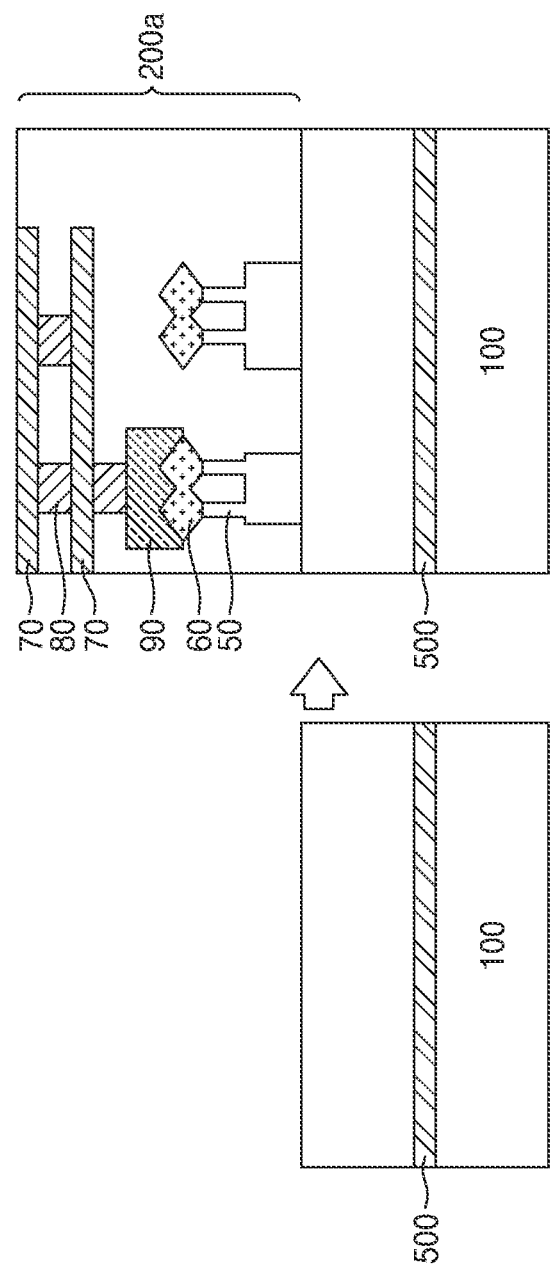

Referring to FIG. 8A, a wafer 100 including an etch stop layer 500 is provided.

A first semiconductor device 200a is provided on the first surface of the wafer 100. Providing the first semiconductor device 200a includes by providing an active device including fins 50 and epitaxial layers 60 provided on the fins 50 on the first surface of the wafer. However, embodiments are not limited thereto. For example, providing the active device may include providing epitaxial layers 60 on nanosheets, nanowires, etc. An epitaxial contact 90 may be provided on the epitaxial layer 60 that extends in a horizontal direction parallel to the first surface of the wafer 100. A via 80 may be provided on the epitaxial contact 90. Metal layers 70 configured to route signals may be provided on the via 80, connected to the epitaxial contact 90, to be connected to the active device. Vias 80 may be provided between the metal layers 70 to connect the metal layers 70.

Referring to FIG. 8B, a wafer-to-wafer bonding process may be carried out. For example, a second wafer 300 may be provided on a first surface of the first semiconductor device 200a. The second wafer 300 may be bonded to the first semiconductor device 200a by providing an adhesive layer 400 between the first semiconductor device 200a and the second wafer 300. However, embodiments are not limited thereto. According to another example embodiment, the second wafer 300 may be directly provided on the first semiconductor device 200a. For example, the second wafer 300 may be directly bonded to the first semiconductor device 200a by a Si direct bonding without using an adhesive layer. After the wafer-to-wafer bonding, the semiconductor architecture may be flipped.

Figure 8C:
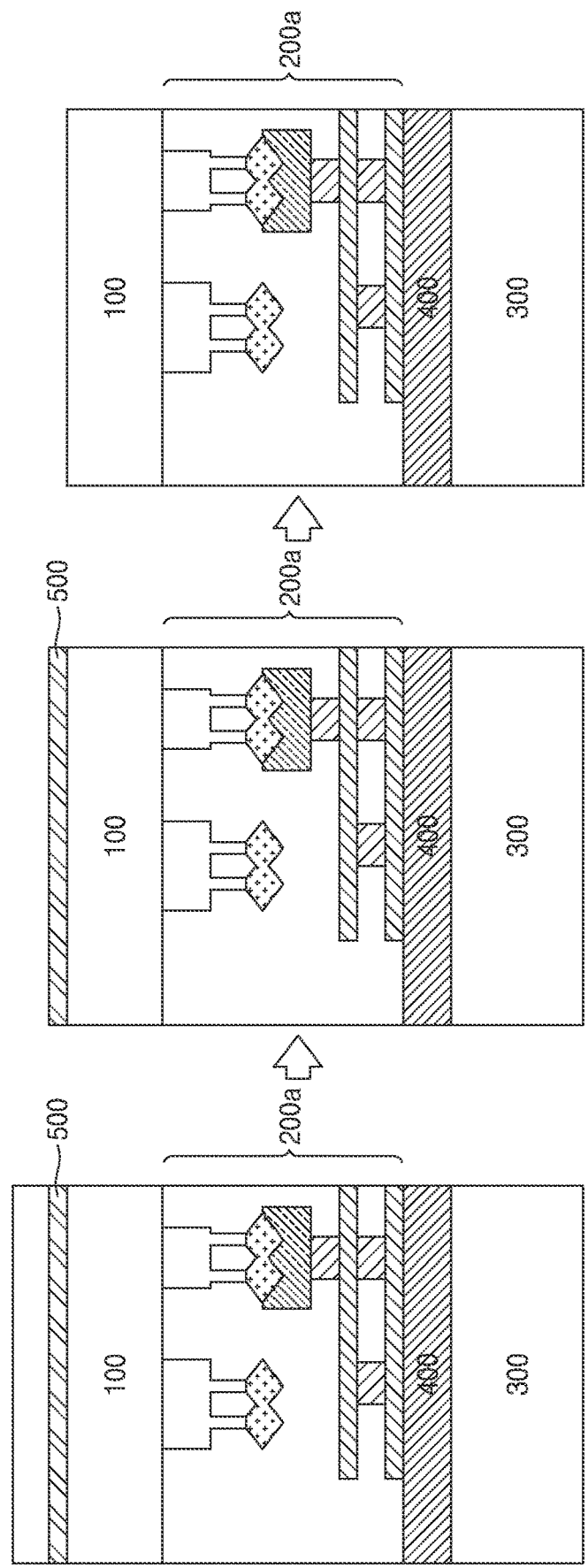

Referring to FIG. 8C, a portion of a back side the wafer 100 from the second surface may be removed to a level of the etch stop layer 500. The etch stop layer 500 may be removed to expose a second surface of the wafer 100. A portion of the wafer 100 and the etch stop layer 500 may be removed by a grinding process including, for example, chemical-mechanical polishing (CMP) or dry etching. However, embodiments are not limited thereto.

Figure 8D:
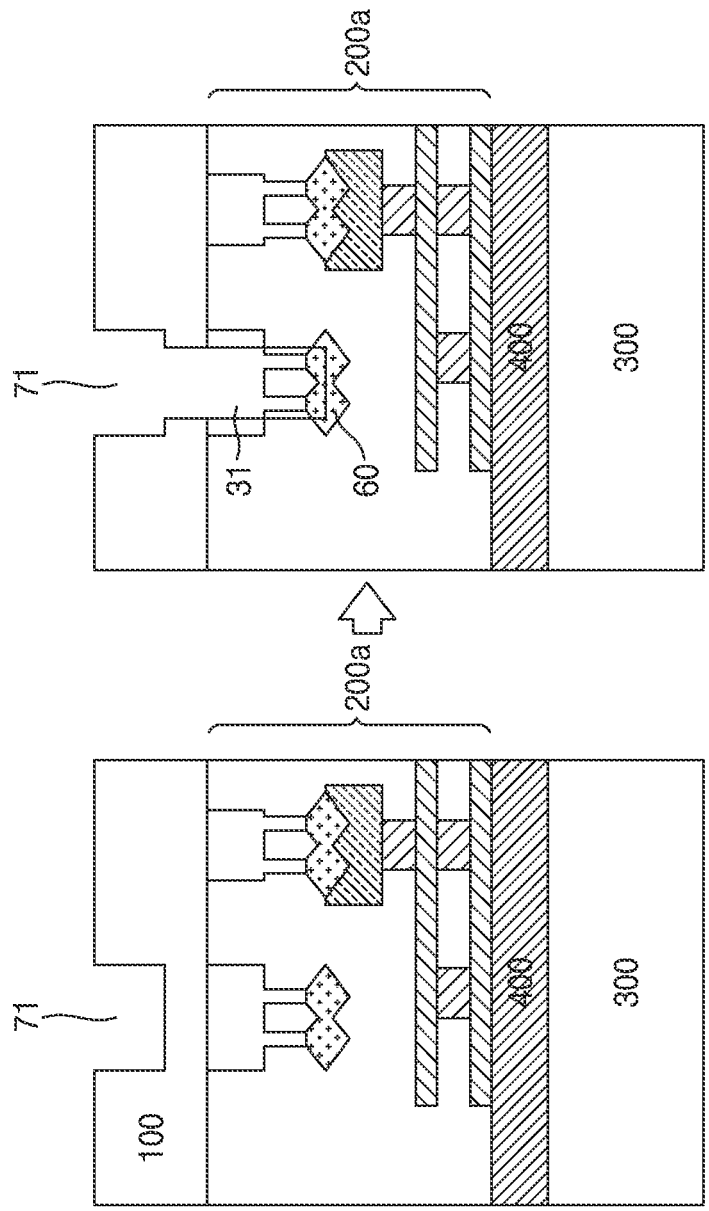

Referring to FIG. 8D, a metal opening 71 may be formed on the exposed surface of the wafer 100. The metal opening may be a trench formed by, for example, dry etching or wet etching. However, embodiments are not limited thereto. The depth of the metal opening 71 may be less than a height of the wafer 100. An TSV opening 31 may be formed from the metal opening 71 to a level of the epitaxial layer 60 included in the first semiconductor device 200a such that the TSV opening 31 exposes the epitaxial layer 60.

Figure 8E:
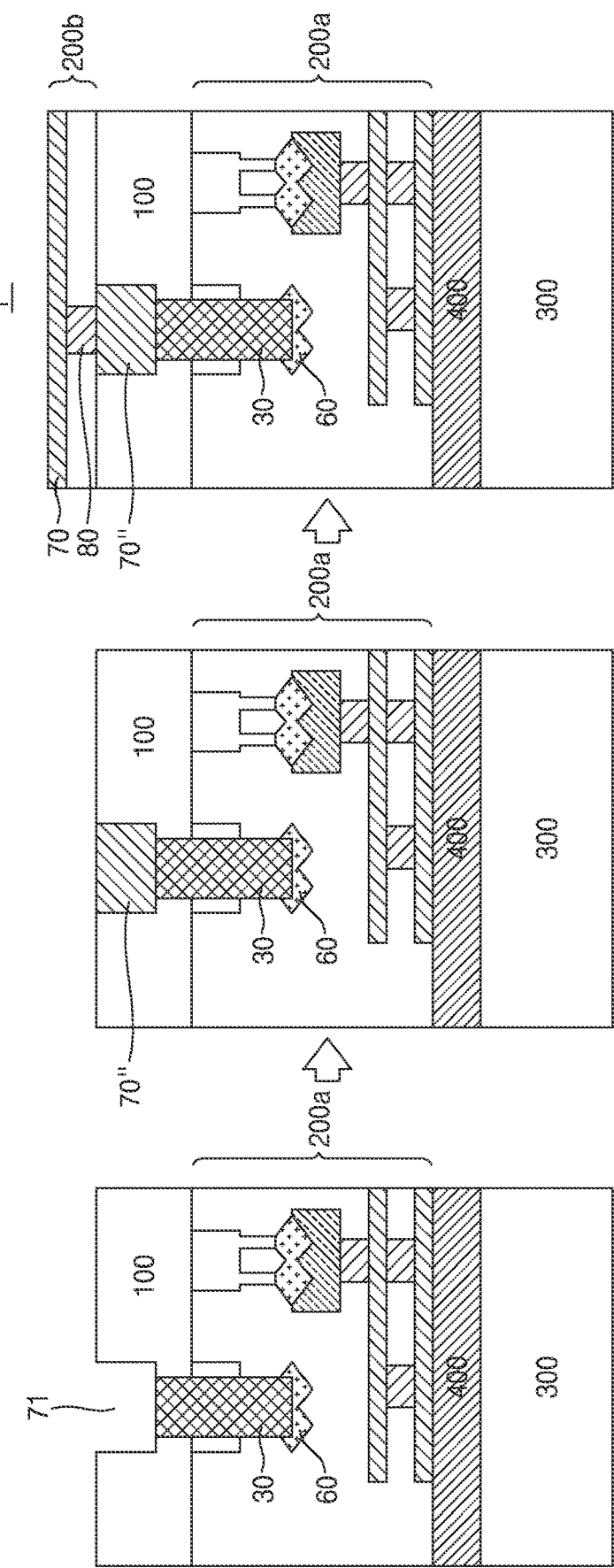

Referring to FIG. 8E, a conductive material with low resistance such as, for example, Cu may be filled in the TSV opening 31 to form the TSV 30. The TSV 30 may be formed to be in direct contact with the epitaxial layer 60.

A second semiconductor device 200b may be provided on the wafer 100 and TSV 30. Providing the second semiconductor device 200b may include filling the metal opening 71 with a conductive material with low resistance such as, for example, Cu to form a power rail metal layer 70" that is configured to supply power. The power rail metal layer 70" may be formed to directly contact the TSV 30. A via 80 is provided on the power rail metal layer 70", and a metal layer 70 is provided on the via 80.

Figure 9:
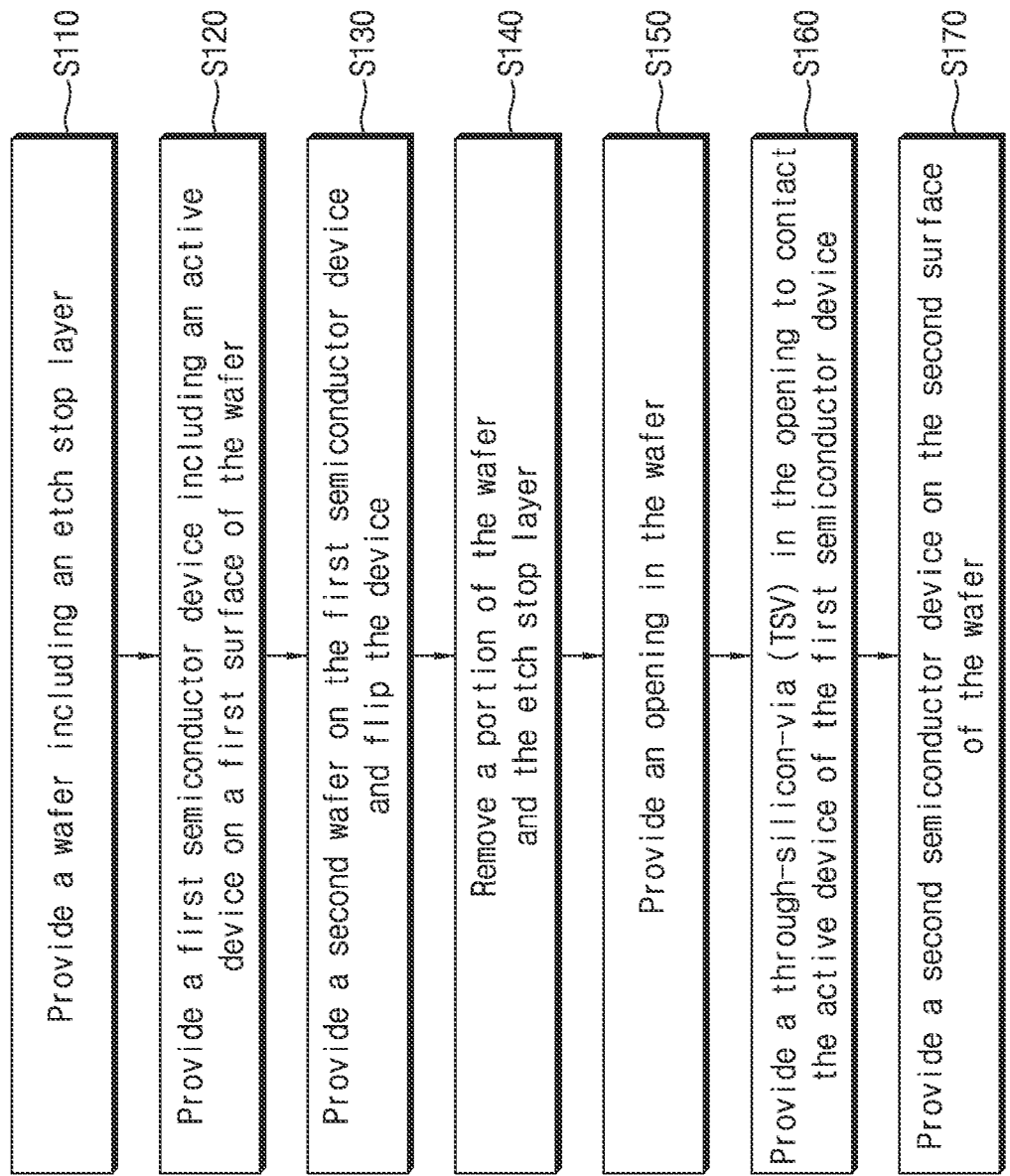
FIG. 9 illustrates a flowchart of a method of manufacturing a BSPDN semiconductor architecture according to an example embodiment.

FIG. 9 is a flowchart illustrating a method of manufacturing a BSPDN semiconductor architecture according to an example embodiment.

According to an example embodiment, a wafer including an etch stop layer is provided (S110). The wafer may be a Si layer, and the etch stop layer may be a silicon germanium (SiGe) layer, but embodiments are not limited thereto. For example, the etch stop layer may be an oxide layer in a silicon-on-insulator (SOI) wafer.

A first semiconductor device is provided on a first surface of the wafer (S120). Providing the first semiconductor device includes providing an active device including fins and epitaxial layers on the first surface of the wafer. An epitaxial contact is provided on the epitaxial layer, and a via is provided on the epitaxial contact. Metal layers are provided on the via connected to the epitaxial contact, and vias may be provided between the metal layers.

A second wafer may be provided on the first semiconductor device (S130). The second wafer may be bonded to the first semiconductor layer by providing an adhesive layer between the first semiconductor device and the second wafer. According to another example embodiment, the second wafer may be directly provided on the first semiconductor device by, for example, a Si direct bonding without using an adhesive layer. The wafer-to-wafer bonded semiconductor architecture may be flipped.

A portion of a back side of the wafer and the etch stop layer may be removed (S140). The etch stop layer may be removed to expose a second surface of the wafer. The wafer and the etch stop layer may be removed by a grinding process such as, for example, CMP or dry etching, but embodiments are not limited thereto.

A opening is provided in the wafer (S150). The opening is formed to a level of the epitaxial layer of the first semiconductor device such that the opening exposes the epitaxial layer. The opening may be a trench formed by dry etching or wet etching a portion of the exposed second surface of the wafer. However, embodiments are not limited thereto.

A TSV is provided in the opening (S160). A conductive material with relatively low resistance such as, for example, Cu is filled in the opening to form the TSV. The TSV is formed to be in direct contact with the epitaxial layer of the first semiconductor device.

A second semiconductor device is provided on the second surface of the wafer and the TSV (S170). Providing the second semiconductor device may include providing a power rail metal layer configured to supply power on the second surface of the wafer and an exposed surface of the TSV. The power rail metal layer is provided to contact the TSV. Vias are provided on the power rail metal layer and a metal layer may be provided on the vias.

FIG. 10 is a flowchart illustrating a method of manufacturing a BSPDN semiconductor architecture according to an example embodiment.

According to an example embodiment, a wafer including an etch stop layer is provided (S210). The wafer may be a Si layer, and the etch stop layer may be a silicon germanium (SiGe) layer, but embodiments are not limited thereto. For example, the etch stop layer may be an oxide layer in a silicon-on-insulator (SOI) wafer.

A first semiconductor device is provided on a first surface of the wafer (S220). Providing the first semiconductor device includes providing an active device including fins and epitaxial layers on the first surface of the wafer. An epitaxial contact is provided on the epitaxial layer, and a via is provided on the epitaxial contact. Metal layers are provided on the via connected to the epitaxial contact, and vias may be provided between the metal layers.

A second wafer may be provided on the first semiconductor device (S230). The second wafer may be bonded to the first semiconductor layer by providing an adhesive layer between the first semiconductor device and the second wafer. According to another example embodiment, the second wafer may be directly provided on the first semiconductor device by, for example, a Si direct bonding without using an adhesive layer. The wafer-to-wafer bonded semiconductor architecture may be flipped.

A portion of a back side of the wafer and the etch stop layer may be removed (S240). The etch stop layer may be removed to expose a second surface of the wafer. The wafer and the etch stop layer may be removed by a grinding process such as, for example, CMP or dry etching, but embodiments are not limited thereto.

A first opening is provided in the wafer (S250). The first opening may be formed to a depth that is less than the thickness of the wafer. The first opening may be a trench formed by, for example, dry etching or wet etching a portion of the wafer. A second opening may be formed from the first opening to a level of the epitaxial layer such that the second opening exposes the epitaxial layer of the first semiconductor device. The second opening may be a trench formed by, for example, dry etching or wet etching.

A TSV is formed in the first opening (S260). A conductive material with relatively low resistance such as, for example, Cu is filled in the second opening to form the TSV. The TSV is formed to contact the epitaxial layer of the first semiconductor device.

A second semiconductor device is provided on the second surface of the wafer (S270). A conductive material with relatively low resistance such as, for example, Cu is filled in the first opening to form a power rail metal layer that is configured to operate as a VDD/VSS power rail to supply power. The power rail metal layer is formed to contact the TSV. At least one via is provided on the power rail metal layer, and a metal layer is provided on the at least one via. The power rail metal layer, the at least one via, and the metal layer may form a second semiconductor device.

According to the example embodiments, a TSV protruding from a second semiconductor device that is provided on a second surface of a wafer is in direct contact with an epitaxial layer included in a first semiconductor device provided on a first surface of the wafer. As there are no additional elements provided between the TSV and the epitaxial layer, the connection resistance of the BSPDN semiconductor architecture according to example embodiments may be lowered. The manufacturing process of the BSPDN semiconductor architecture may be simplified and the manufacturing cost may be reduced. In addition, there is no concern for a misalignment between the TSV and a BPR which may lead to misalignment between the first semiconductor device and the second semiconductor device. Thus, the performance of the BSPDN semiconductor architecture according to example embodiments may be improved.

Figure 11:
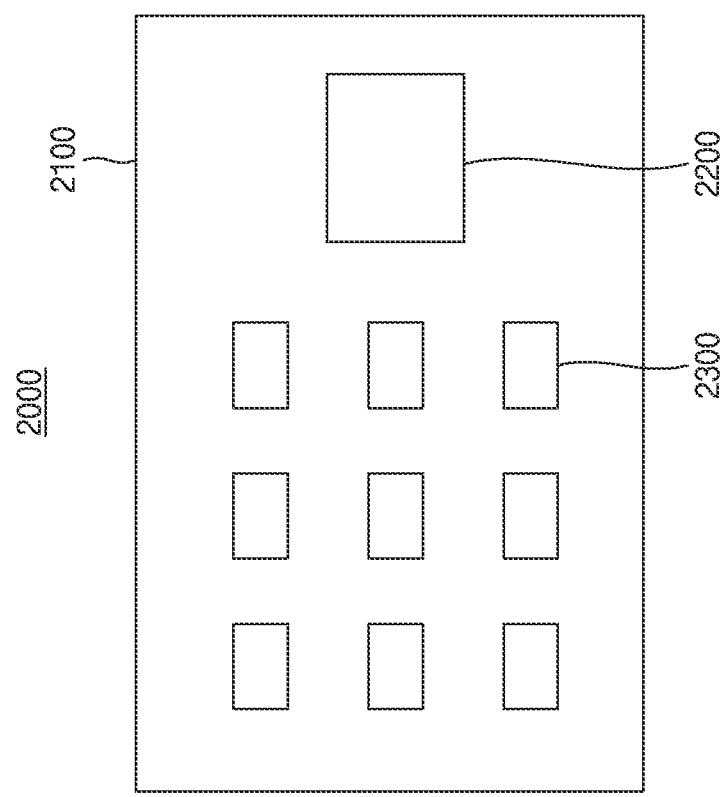
FIG. 11 illustrates a semiconductor architecture that may incorporate the BSPDN semiconductor architectures according to example embodiments.

FIG. 11 illustrates a semiconductor package that may incorporate the BSPDN semiconductor architectures according to example embodiments.

Referring to FIG. 11, a semiconductor package 2000 according to an example embodiment may include a processor 2200 and semiconductor devices 2300 that are mounted on a substrate 2100. The processor 2200 and/or the semiconductor devices 2300 may include one or more of BSPDN semiconductor architecture described in the above example embodiments.

Figure 12:
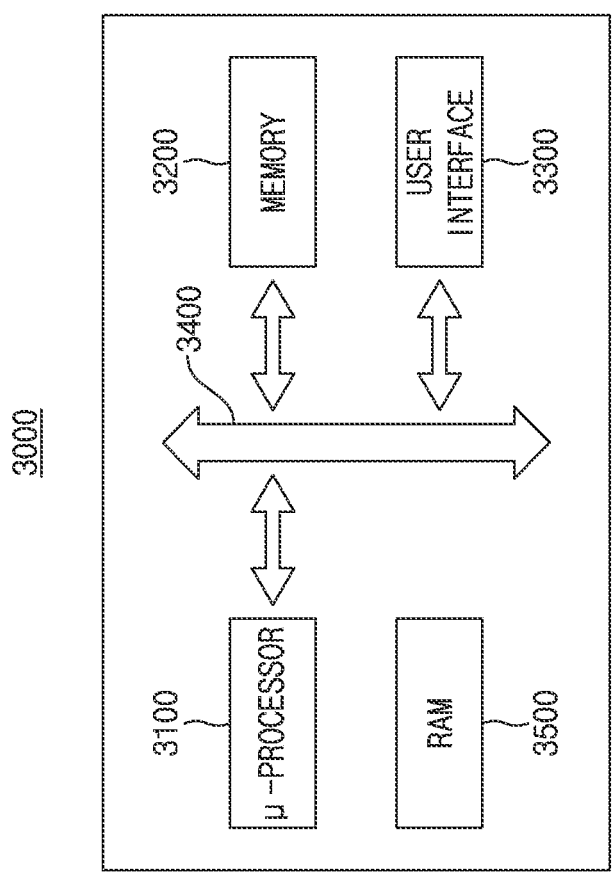
FIG. 12 illustrates a schematic block diagram of an electronic system that may incorporate the BSPDN semiconductor architecture according to example embodiments.

FIG. 12 illustrates a schematic block diagram of an electronic system according to an example embodiment.

Referring to FIG. 12, an electronic system 3000 in accordance with an embodiment may include a microprocessor 3100, a memory 3200, and a user interface 3300 that perform data communication using a bus 3400. The microprocessor 3100 may include a central processing unit (CPU) or an application processor (AP). The electronic system 3000 may further include a random access memory (RAM) 3500 in direct communication with the microprocessor 3100. The microprocessor 3100 and/or the RAM 3500 may be implemented in a single module or package. The user interface 3300 may be used to input data to the electronic system 3000, or output data from the electronic system 3000. For example, the user interface 3300 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 3200 may store operational codes of the microprocessor 3100, data processed by the microprocessor 3100, or data received from an external device. The memory 3200 may include a memory controller, a hard disk, or a solid state drive (SSD).

At least the microprocessor 3100, the memory 3200 and/or the RAM 3500 in the electronic system 3000 may include BSPDN semiconductor architecture as described in the above example embodiments.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. A semiconductor architecture comprising:
a semiconductor substrate;
a first semiconductor device configured to route signals that is provided on a first surface of the semiconductor substrate, the first semiconductor device comprising an active device that comprises an epitaxial layer;
a second semiconductor device configured to supply power that is provided on a second surface of the semiconductor substrate opposite to the first surface; and
a through-silicon via (TSV), comprising a first surface and a second surface opposite to the first surface, the second surface of the TSV contacting the second semiconductor device, and the TSV protruding from the second semiconductor device and connected to the epitaxial layer of the active device,
wherein the TSV protrudes from the first surface of the semiconductor substrate and the first surface of the TSV directly contacts the epitaxial layer in a vertical direction.

2. The semiconductor architecture according to claim 1, wherein the first semiconductor device further comprises a signal routing layer comprising:
a first via provided on the active device;
metal layers provided on the first via; and
a second via provided between the metal layers.

3. The semiconductor architecture according to claim 1, wherein the TSV penetrates through the semiconductor substrate.

4. The semiconductor architecture according to claim 1, wherein the second semiconductor device further comprises:
a power rail provided on the TSV and configured to supply the power;
a third via provided on the power rail; and
a metal layer provided on the third via.

5. The semiconductor architecture according to claim 4, wherein the TSV is configured to deliver the power from the power rail to the active device.

6. The semiconductor architecture according to claim 4, wherein the TSV extends from a surface of the power rail to the epitaxial layer of the active device.

7. The semiconductor architecture according to claim 6, wherein the TSV contacts the power rail.

8. The semiconductor architecture according to claim 4, wherein the TSV penetrates through the semiconductor substrate such that an end portion of the TSV is distant from the first surface of the semiconductor substrate.

9. The semiconductor architecture according to claim 4, wherein a height of the TSV ranges from 200 nm to 500 nm.

10. A semiconductor architecture comprising:
a semiconductor substrate;
a first semiconductor device provided on a first surface of the semiconductor substrate, the first semiconductor device comprising an active device that comprises an epitaxial layer;
a second semiconductor device provided on a second surface of the semiconductor substrate opposite to the first surface, the second semiconductor device comprising a power rail configured to supply power; and
a through-silicon via (TSV)), comprising a first surface and a second surface opposite to the first surface, the second surface of the TSV contacting the second semiconductor device, and the TSV protruding from the power rail and extending to a level of the epitaxial layer of the active device, wherein the TSV protrudes from the first surface of the semiconductor substrate and the first surface of the TSV directly contacts the epitaxial layer in a vertical direction.

\* \* \* \* \*